(12) United States Patent
Chen

(10) Patent No.: US 6,267,178 B1
(45) Date of Patent: Jul. 31, 2001

(54) BUILT-UP HEAT EXCHANGER

(76) Inventor: Yun-Ching Chen, 2$^{nd}$ F., No. 10, Lane 147, Yan-Ping N. Rd., Sec. 5, Taipei (TW)

( * ) Notice: Subject to any disclaimer, the term of this patent is extended or adjusted under 35 U.S.C. 154(b) by 0 days.

(21) Appl. No.: 09/627,492

(22) Filed: Jul. 28, 2000

Related U.S. Application Data

(62) Division of application No. 09/312,041, filed on May 14, 1999.

(51) Int. Cl.$^7$ ............................... F28F 7/00; H05K 7/20
(52) U.S. Cl. ..................... 165/185; 165/80.3; 361/678; 361/690; 361/704
(58) Field of Search ................... 165/185, 80.3; 361/678, 690, 695, 704, 709, 710, 711

(56) References Cited

U.S. PATENT DOCUMENTS

| | | | |
|---|---|---|---|
| 5,794,684 | * | 8/1998 | Jacoby ........................... 165/185 |
| 5,870,287 | * | 2/1999 | Rodriguez et al. ............... 361/710 |
| 5,953,212 | * | 9/1999 | Lee ................................. 165/185 |
| 6,009,938 | * | 1/2000 | Smith et al. ..................... 165/185 |

* cited by examiner

*Primary Examiner*—Ira S. Lazarus
*Assistant Examiner*—Tho Van Duong
(74) *Attorney, Agent, or Firm*—Pro-Techtor International Services

(57) ABSTRACT

A built-up heat exchanger including a seat and a plurality of radiators superposed on a top of the seat is provided. The seat is made of a thermal conductive material in sheet form and has at least two notches formed on a top surface thereof. The a plurality of radiators are made of a thermal conductive material in sheet form and are punched to form a plurality of upward extended fins and at least two downward projected ridges corresponding to the at least two notches on the seat, such that any of the radiators may be superposed on the top surface of the seat with the at least two downward projected ridges fitly received in the at least two notches. Since the number of fins formed on each radiator and the number of radiators superposed on the seat may be freely decided depending on actual need, the built-up heat exchanger may be used in different applications.

5 Claims, 5 Drawing Sheets

BUILT-UP HEAT EXCHANGER

This is a divisional application of applicant's U.S. patent application Ser. No. 09/312,041, filed on May 14, 1999.

BACKGROUND OF THE INVENTION

The present invention relates to a built-up heat exchanger, and more particularly to a built-up heat exchanger of which a total heat radiating surface area may be easily adjusted according to actual need in different applications.

Following the rapid development in the information industry, various kinds of electronic elements, such as chips, microprocessors, etc., all have considerably high working temperatures. It is therefore necessary to provide such elements with heat radiating means in the form of heat exchanging device.

A conventional heat exchanging device includes a radiator integrally formed from a whole piece of extruded aluminum. Such one-piece extruded aluminum radiator requires large mount of aluminum material and high manufacturing cost and is therefore very expensive. To eliminate disadvantages existing in the conventional one-piece radiator, less expensive built-up radiators are developed.

Please refer to FIG. 1 that is a perspective of a conventional built-up radiator that mainly includes a seat 2 for fixedly receiving a plurality of radiating fins 1 thereon. The radiating fin 1 each is in the form of a plate having a lower end vertically inserted in one of a plurality of parallel grooves formed on the seat 2. The parallel grooves include deep and shallow grooves 21 and 22, respectively, alternately arranged on the seat 2. The radiating fins 1 are inserted in the deep grooves 21.

A radiator built up from the above-described radiating fins 1 and seat 2 has the following drawbacks:

A. There are fixed numbers of deep grooves 21 on the seat 2 for receiving only fixed numbers of radiating fins 1. Therefore, the radiator so formed has limited radiating efficiency due to limited heat radiating surface area provided by the fixed numbers of radiating fins 1 and can not be adapted to applications that require higher radiating efficiency.

B. Although the radiating fins 1 can be designed to have different heights to increase total radiating surface area thereof, the radiating fins 1 tend to move in or even separate from the deep grooves 21 if they are too high in length. Moreover, the lengthened radiating fins 1 would require considerably large mounting space.

C. The deep grooves 21 do not provide sufficient strength for associating the radiating fins 1 with the seat 2, particularly when the radiator formed from the radiating fins 1 and the seat 2 has an increased volume.

It is therefore tried by the inventor to develop a built-up heat exchanger that would eliminate the drawbacks existing in the conventional one-piece radiator.

SUMMARY OF THE INVENTION

A primary object of the present invention is to provide a built-up heat exchanger formed from a seat and a plurality of superposed radiators having adjustable numbers of radiating fins formed thereon by means of punching, so that the built-up heat exchanger is adapted to various applications having different heat radiating requirements.

To achieve the above object, the built-up heat exchanger according to the present invention mainly includes a seat and a plurality of radiators superposed on a top of the seat. The seat is made of thermal conductive material in sheet form and has at least two notches formed on a top surface thereof; and the radiators are made of thermal conductive material in sheet form and are punched to form a plurality of upward extended fins and at least two downward projected ridges corresponding to the two notches on the seat, such that any of the radiators may be superposed on the top surface of the seat with the at least two downward projected ridges fitly received in the at least two notches.

BRIEF DESCRIPTION OF THE DRAWINGS

The above and other objects and the features and effects of the present invention may be best understood by referring to the following detailed description of the preferred embodiments and the accompanying drawings, wherein.

DETAILED DESCRIPTION OF THE PREFERRED EMBODIMENTS

Figure 1:
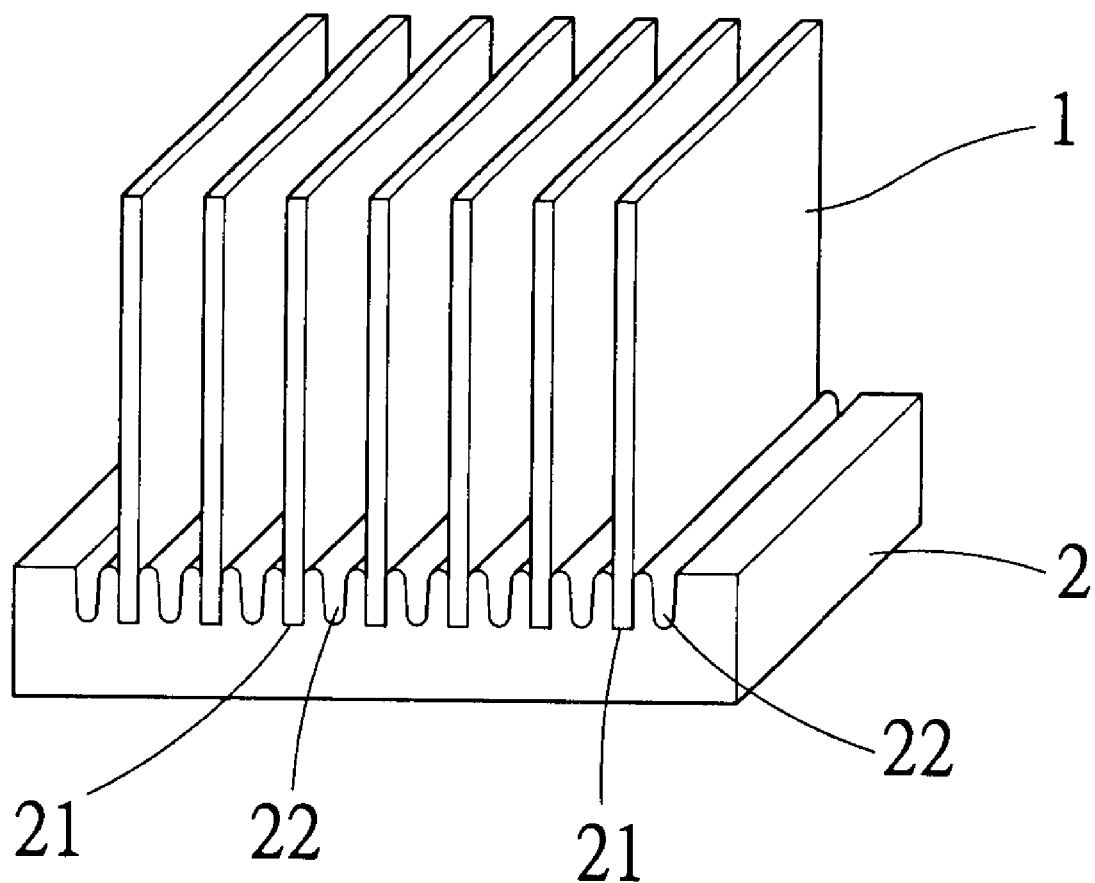
FIG. 1 is a perspective of a conventional built-up radiator.
Figure 2:
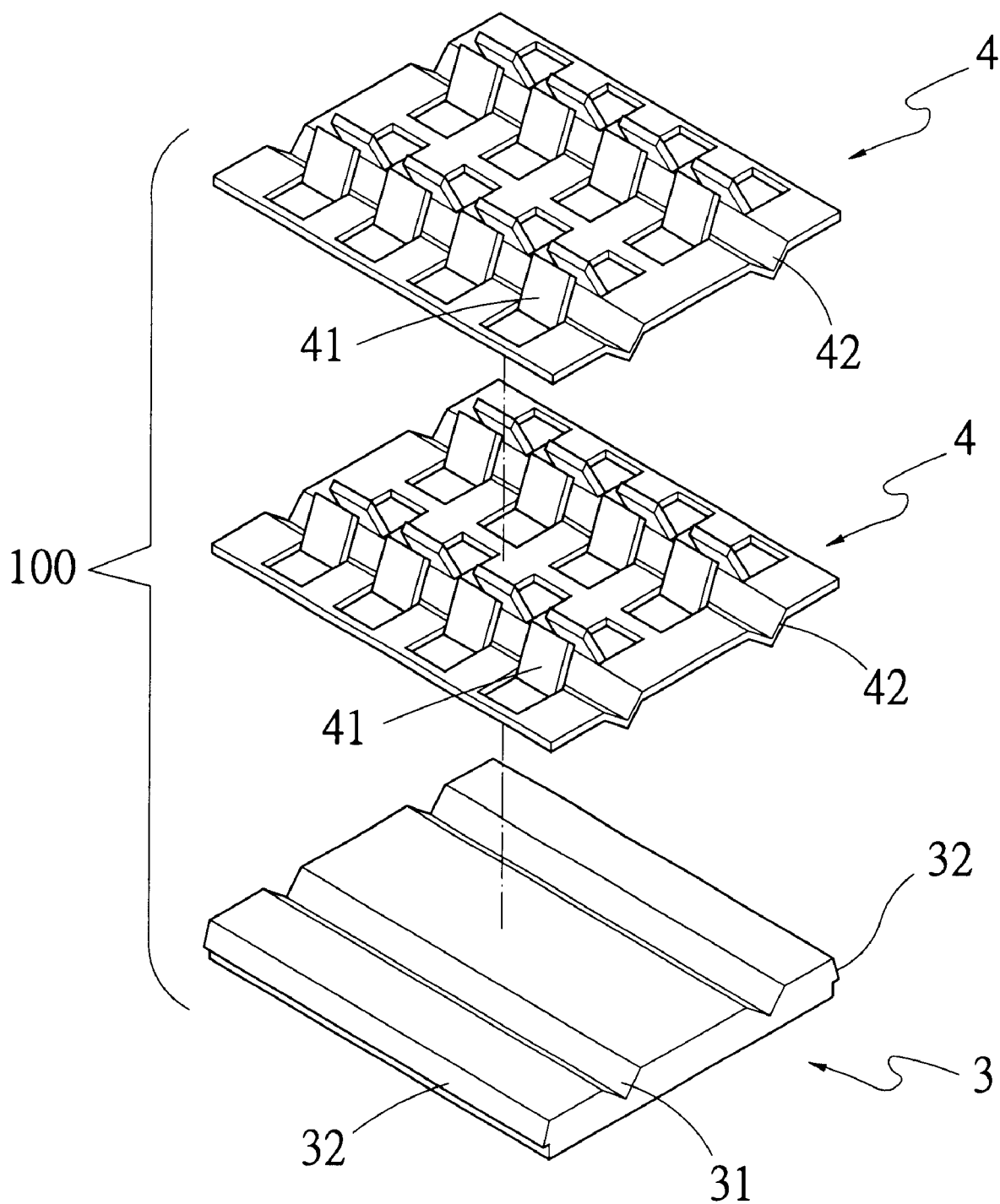
FIG. 2 is an exploded perspective of the built-up heat exchanger according to an embodiment of the present invention.

Please refer to FIG. 2 that is an exploded perspective of a heat exchanger 100 of the present invention. As shown, the built-up heat exchanger 100 mainly includes a seat 3 and a plurality of radiators 4 superposed on the seat 3.

The seat 3 is made of thermal conductive material in sheet form and has predetermined dimensions. Two notches 31 having V-shaped cross section are formed on a top surface of the seat 3. Two symmetrical and sideward projected ribs 32 are formed along two lateral edges of the seat 3 in parallel with the two notches 31.

The a plurality of radiators 4 are made of thermal conductive material in sheet form and has predetermined dimensions. Each of the radiators 4 is punched to form a plurality of upward extended fins 41 and two downward projected ridges 42. The ridges 42 have V-shaped cross section corresponding to that of the notches 31 on the seat 3 and are formed at positions corresponding to the notches 31, too. The fins 41 are arranged in symmetrical rows on top surfaces of the radiators 4 and are symmetrically arranged at two longitudinal sides of each ridge 42. Therefore, any two radiators 4 may be superposed with the two ridges 42 of an upper radiator 4 separately aligned with the two ridges 42 of a lower radiator 4.

Figure 3:
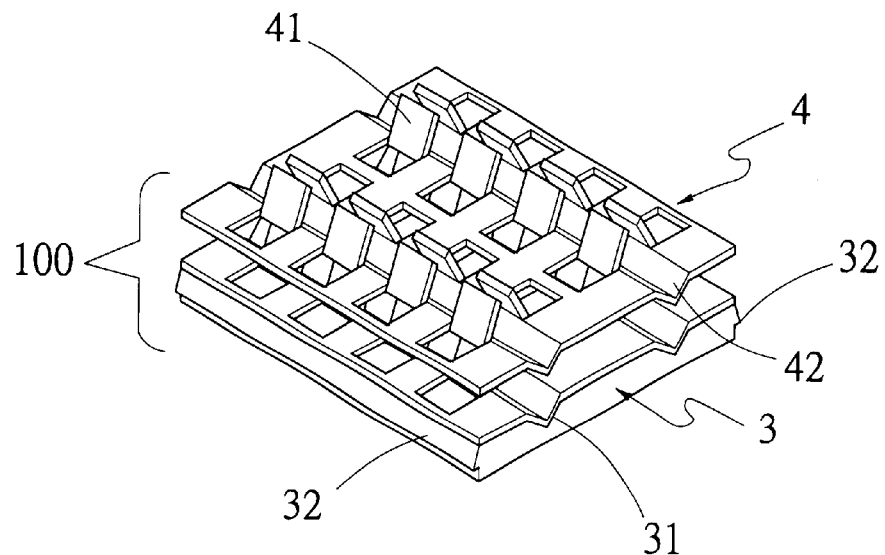
FIG. 3 is an assembled perspective of the built-up heat exchanger of FIG. 2.
Figure 4:
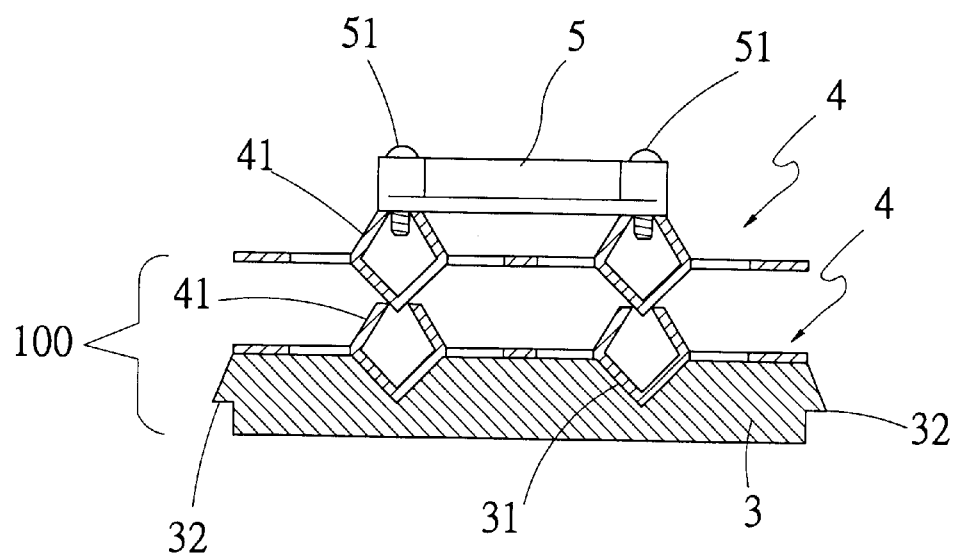
FIG. 4 is a sectional view of the built-up heat exchanger of FIG. 3 with a cooling fan mounted to a top thereof.

The a plurality of radiators 4 are sequentially superposed on the top surface of the seat 3, as shown in FIGS. 3 and 4. The number of radiators 4 superposed on the seat 3 may be decided depending on actual need of the built-up heat exchanger 100 in different applications. In an embodiment illustrated in FIGS. 2 through 6, there are two radiators 4 superposed on the seat 3.

Before the radiators 4 are superposed on the top surface of the seat 3, a selected type of thermal conductive glue or adhesive, such as epoxy resin, is applied over a bottom surface of each ridge 42 of the radiators 4. The two bottom-glued ridges 42 of a first radiator 4 that is directly superposed on the seat 3 are separately firmly adhered to the two notches 31 of the seat 3, and the two bottom-glued ridges 42 of the other radiators 4 that are sequentially superposed on one another above the first radiator 4 and the seat 3 are separately firmly located in spaces provided between two rows of fins 41 at two sides of each of the two ridges 42 of a lower radiator 4.

The built-up heat exchanger 100 may be mounted onto an element surface from which a large amount of heat is produced and needs to be radiated quickly. The fins 41 on the radiators 4 of the heat exchanger 100 provide largely increased heat radiating surface area and accordingly upgraded radiation efficiency. The number of fins 41 punched on each radiator 4 may be decided depending on the actual need in different applications of the built-up heat exchanger 100. The fins 41 at two sides of each ridge 42 of a lower radiator 4 provide a base for locating a ridge 42 of an upper radiator 4. Glue applied over the bottom surface of the ridges 41 further ensures a firm association of the upper radiator 4 with the seat 3 or the lower radiator 4.

To further enhance the radiation efficiency of the built-up heat exchanger 100, a cooling fan 5 maybe mounted and locked onto a top of a highest radiator 4 on the seat 3 by downward threading screws 51 through the cooling fan 5 into the spaces provided between two symmetrical rows of fins 41 on the radiators 4, as shown in FIG. 4.

Figure 5:
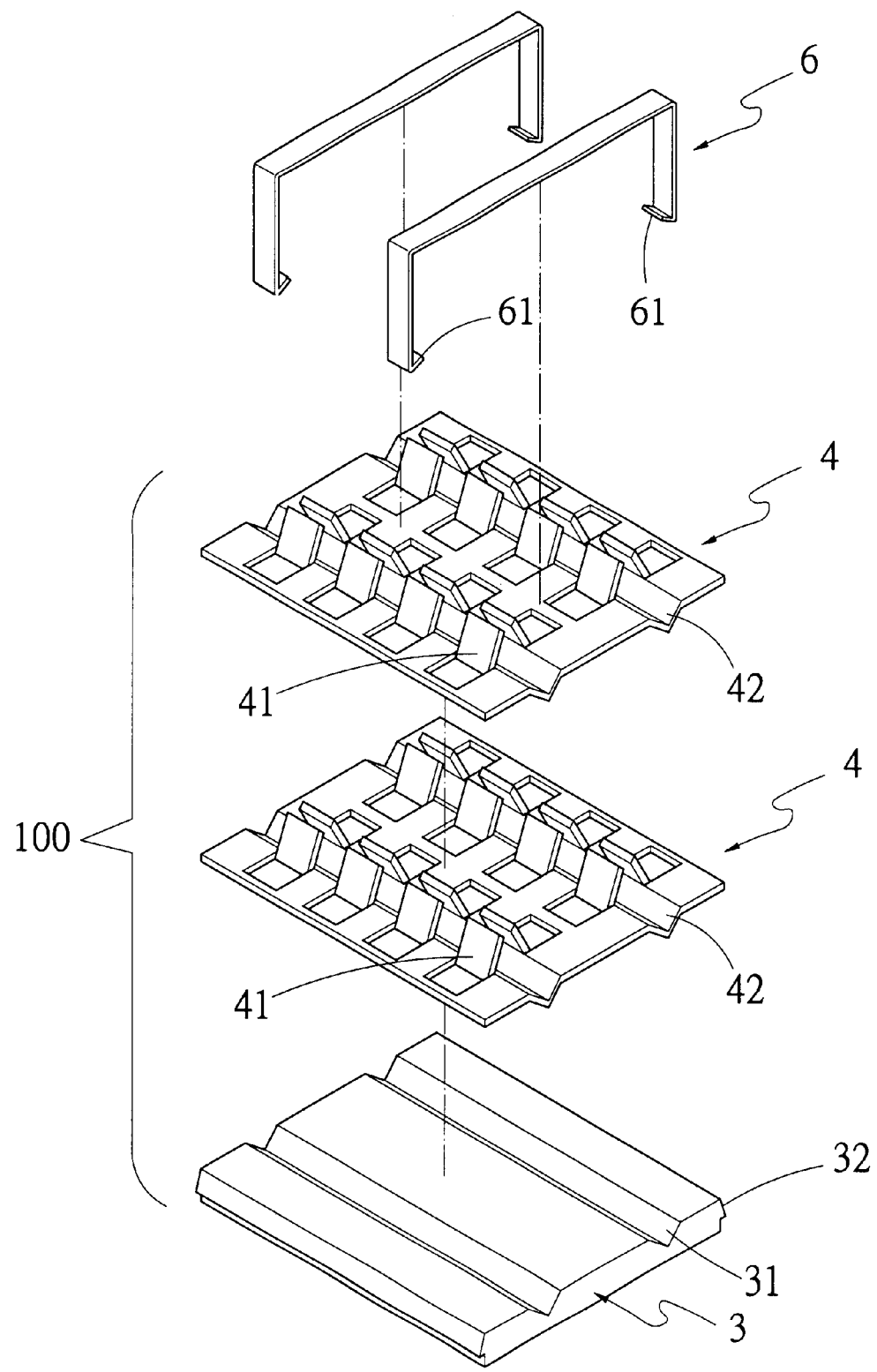
FIG. 5 is an exploded perspective of the built-up heat exchanger of FIG. 4 showing the superposed radiators and seat of the heat exchanger are firmly bound with fastening means.
Figure 6:
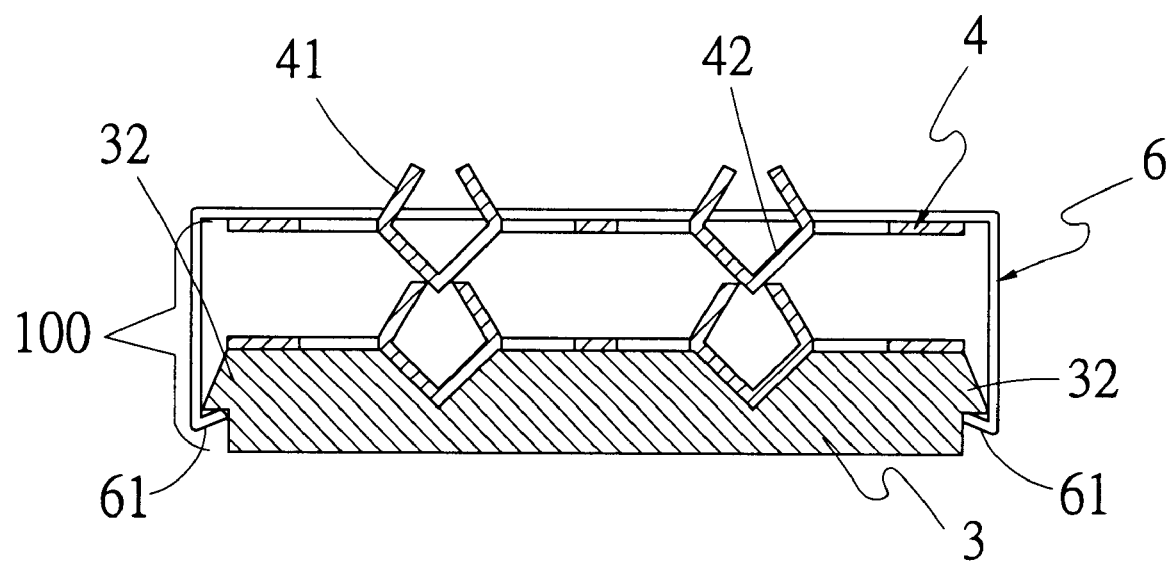
FIG. 6 is a sectional view of the built-up heat exchanger of FIG. 5.

And, to further ensure a firm and stable superposition of the radiators 4 on the seat 3 by means of glued bottom surfaces of the ridges 42, additional fastening means, such as two or more ampers 6, can be used to clamp and retain the superposed radiators 4 to the seat 3. FIGS. 5 and 6 are exploded perspective and sectional views, respectively, of the built-up heat exchanger 100 provided with two clampers 6. The clamper 6 each has two downward extended hooked legs 61 that are caught by the ribs 32 at two lateral sides of the seat 3 when the clamper 6 is positioned over the superposed radiators 4 and seat 3.

Advantages and features of the present invention are summarized as follows:

A. Since the number of fins 41 on the radiators 4 may be decided depending on actual need in different applications of the heat exchanger 100, the radiation effect of the present invention is adjustable without limitation, allowing the present invention to be used in wide ranges.

B. Since the radiators 4 superposed on the seat 3 may be increased in number depending on actual need without occupying too much space, the use and mounting of the built-up heat exchanger 100 is not limited due to spatial factors.

C. The radiators 4 and the seat 3 may be easily assembled, allowing the built-up heat exchanger 100 to be particularly suitable for use in products that require big-volume radiators.

What is to be noted is the form of the present invention shown and disclosed is to be taken as a preferred embodiment of the invention and that various changes in the shape, size, and arrangements of parts may be resorted to without departing from the spirit of the invention or the scope of the subjoined claims. For instance, the radiators 4 maybe punched to form the fins 41 in different numbers, in different positions, and/or at different inclining angles.

Moreover, the cooling fan 5 is not necessarily mounted onto the highest radiator 4 on the seat 3 by means of screws. An alternative of mounting the cooling fan 5 is to form a through hole centered at the superposed radiators 4 and having a diameter slightly smaller than an outer periphery of the cooling fan 5, so that the cooling fan 5 is received in the through hole with its outer periphery supported on an outer periphery of the through hole on the highest radiator 4 and fixed thereto by means of screws 51. For this purpose, it is not necessary to form fins 41 on the radiators 4 in areas intended for the through hole for mounting the cooling fan 5.

What is claimed is:

1. A built-up heat exchanger comprising:

a seat and a plurality of radiators superposed on a top surface of said seat;

said seat being made of thermal conductive material in sheet form and having at least two notches formed on said top surface of said seat; wherein said plurality of radiators is made of thermal conductive material in sheet form, each of said radiators being punched to form a plurality of upward extended fins and at least two downward projected ridges corresponding in position to said at least two notches on said seat, such that any of said radiators may be superposed on the top surface of said seat with said at least two downward projected ridges being received in and contacting sides of said at least two notches, and wherein each said fin is associated with an opening in said radiator.

2. The built-up heat exchanger as claimed in claim 1, wherein:

said at least two notches on said seat and said at least two ridges on said plurality of radiators have V-shaped cross sections.

3. The built-up heat exchanger as claimed in claim 1, wherein:

said fins on said radiators are arranged in symmetrical rows on top surfaces of said radiators and are symmetrically arranged at two longitudinal sides of each said ridge, such that any two of said radiators may be superposed with said ridges of an upper radiator separately aligned with said ridges of a lower radiator.

4. The built-up heat exchanger as claimed in claim 2, wherein:

said fins on said radiators are arranged in symmetrical rows on top surfaces of said radiators and are symmetrically arranged at two longitudinal sides of each said ridge, such that any two of said radiators may be superposed with said ridges of an upper radiator separately aligned with said ridges of a lower radiator.

5. The built-up heat exchanger as claimed in claim 1, wherein:

said seat is provided along two lateral edges with symmetrical and sideways projected ribs to which clampers may be hooked for firmly clamping said superposed radiators between said seat and said clampers.

* * * * *